(12) United States Patent
Maloney et al.

(10) Patent No.: US 6,510,033 B1
(45) Date of Patent: Jan. 21, 2003

(54) RC-TIMER CIRCUIT TO REDUCE CURRENT LEAKAGE IN FUTURE SEMICONDUCTOR PROCESSES

(75) Inventors: Timothy J. Maloney, Palo Alto, CA (US); Wilson S. Kan, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 09/608,909

(22) Filed: Jun. 30, 2000

(51) Int. Cl.[7] ............................................... H02H 3/00
(52) U.S. Cl. ................................. 361/111; 361/56
(58) Field of Search .......................... 361/54, 56, 111; 327/309, 310; 257/355, 367, 327

(56) References Cited

U.S. PATENT DOCUMENTS

| | | | |
|---|---|---|---|
| 5,719,737 A | * | 2/1998 | Maloney ..................... 361/111 |
| 5,828,259 A | | 10/1998 | Cases et al. |
| 5,835,328 A | | 11/1998 | Maloney et al. |
| 5,838,146 A | * | 11/1998 | Singer ....................... 12/115.2 |
| 5,907,464 A | | 5/1999 | Maloney et al. |
| 5,940,258 A | * | 8/1999 | Duvvury ....................... 361/56 |
| 5,946,177 A | * | 8/1999 | Miller et al. .................. 361/56 |
| 5,956,219 A | | 9/1999 | Maloney |
| 6,008,970 A | | 12/1999 | Maloney et al. |

FOREIGN PATENT DOCUMENTS

WO        WO99/66619        12/1999

OTHER PUBLICATIONS

Merrill, Richard, et al., "ESD Design Methodology," EOS/ESD Symposium 93–233, National Semiconductor Fairchild Research Center, (1993) 5 pages.

PCT Search Report, Int'l application no. PCT/US01/17262, mailed Apr. 15, 2002, 4 pages.

* cited by examiner

*Primary Examiner*—Kim Huynh
(74) *Attorney, Agent, or Firm*—Howard A. Skaist (57) ABSTRACT

A resistive capacitive timer scheme is described. Specifically, the invention includes a circuit to compensate for a leakage current through a capacitor in the resistive capacitive timer.

14 Claims, 7 Drawing Sheets

RC-TIMER CIRCUIT TO REDUCE CURRENT LEAKAGE IN FUTURE SEMICONDUCTOR PROCESSES

BACKGROUND

1. Field

This disclosure relates to timer circuits, and, more particularly, to resistivecapacitive (RC) timer circuits.

2. Background Information

Advancements in silicon processing technologies employed to manufacture integrated circuits (ICs) may include, for example, reduction in circuit element sizes. Such reduction in circuit element sizes is one way the performance of such ICs may be improved and may be referred to as "scaling." Those of skill in the art would be aware that current silicon processing technologies have circuit element dimensions, such as transistor sizes, which are smaller than 200 nano-meters (nm). Such processes are typically referred to as "sub-micron" processes.

Such scaling, typically, has not had any significant adverse effects on the performance of most circuit designs, that is, circuit designs, historically, have typically required little modification to maintain functionality from one process generation to the next other than scaling such circuits in a corresponding manner with such process advancements. However, as further advancements are made in the area of sub-micron processes, the effects of such scaling, such as parasitics, for example, may become more pronounced. Parasitics, as they are typically referred to by those of skill in the art, in this context, may be defined as non-ideal, or intrinsic electrical characteristics of circuits embodied in such an IC. Such intrinsic characteristics may comprise, for example, capacitance, resistance and leakage currents. However, in future process generations, these factors may result in such circuits no longer working as intended by merely scaling the circuit elements in a manner corresponding with that process' advancements. Therefore alternative embodiments of such circuits may be desired.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As was previously indicated, while adjustments related to scaling from one semiconductor process to another have been employed for certain circuit embodiments, other changes, such as additional circuit elements, for example, have typically not been required. As was also previously indicated, future embodiments of manufacturing processes for integrated circuit (IC) semiconductor components may have intrinsic characteristics that result in the foregoing approach no longer being adequate. For future semiconductor processes, certain types of circuits may require modifications beyond merely scaling the circuit elements in order to have such circuits function as expected. One such as aspect of these processes that may result in the foregoing is an increase in the leakage current of gate oxide, such as may be employed for insulated gate field effect transistors, for example.

Historically, gate oxide leakage has been substantially negligible relative to other circuit design parameters and typically was not a major consideration in the design, simulation or manufacture of ICs on such processes. Future advanced semiconductor processes, however, may have intrinsic gate oxide leakage on the order of several amperes per centimeter squared ($A/cm^2$). Leakage of this magnitude may be on the order of which can no longer be ignored or merely treated as a secondary consideration for certain types of circuits embodied on such processes.

In this respect, circuits employing resistive-capacitive timers (RC-timers) may be adversely affected by such leakage current and may, therefore, need design modifications beyond scaling in order to function as desired. Therefore, as was previously indicated, alternative embodiments for such circuits may be desirable.

Figure 1:
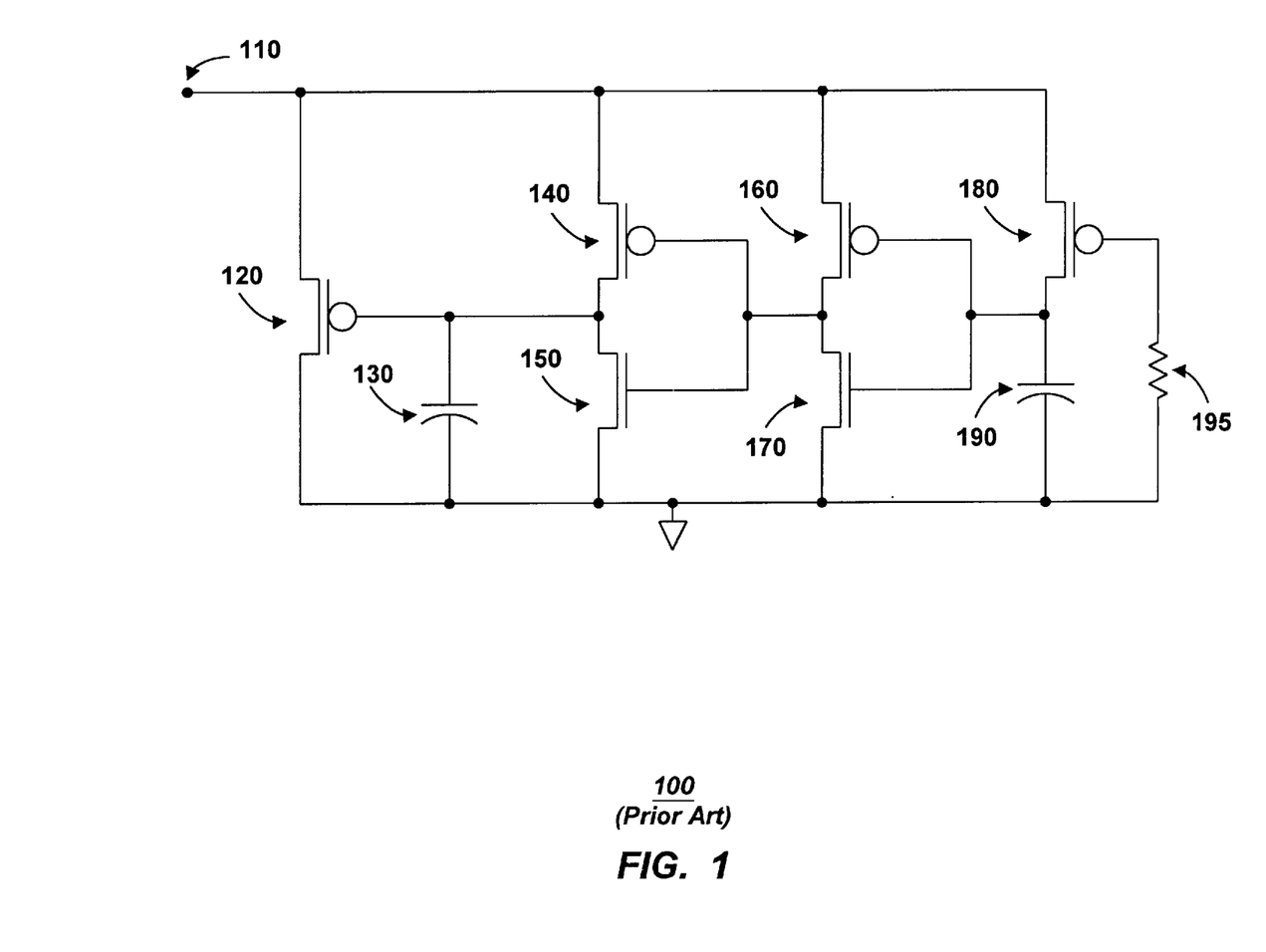
FIG. 1 is a schematic diagram illustrating a current embodiment of a power supply clamp.

FIG. 1 illustrates a current embodiment of a circuit employing such an RC-timer as might be included on current semiconductor processes. The circuit in FIG. 1 is an embodiment of a power supply clamp circuit that is typically employed in ICs as one element of a circuit network to reduce the likelihood of catastrophic damage that may occur due to an electrostatic discharge (ESD) event. Such events are well known in the art and, at a high level, may result from an electrically charged body being discharged into an IC, for example. In this particular embodiment, the RC-timer comprises capacitor 190, resistor 195 and p-channel transistor 180. Such a circuit would typically be connected between a power supply terminal, such as 110, and ground, as illustrated in FIG. 1.

In such an embodiment, transistor 180 typically functions as the resistance for such an RC timer and, in this regard, would typically have a resistance in the Mega-ohm (Mohm) range. In normal operation, once capacitor 190 has charged to a voltage substantially above the threshold of the inverter comprising transistors 160 and 170, that inverter would "trip." For this particular embodiment, this inverter may be termed the first drive stage for current sinking device 120. In this context, tripping such an inverter, which is a wellknown term to those of skill in the art, would result in such an inverter changing states. For this scenario, for example, the inverter would transition from asserting the voltage applied to terminal 110, via transistor 160, to asserting ground, via transistor 170, on the gates of transistors 140 and 150, which together form a second inverter. This second inverter may be termed the second drive stage for current sinking device 120. Likewise, the voltage asserted on terminal 110 would be asserted on the gate of transistor 120 via transistor 140, turning transistor 120 off. For this particular embodiment, until the foregoing sequence is completed, the power supply terminal would be clamped to ground.

Typically, in such an embodiment, the time required to charge an RC-timer, "trip" the two inverters and turn off the current sinking transistor, would be of a duration that would not result in physical damage to, for example, metal lines used for power distribution in such ICs. However, the time required for such a sequence would typically be longer than the duration of most ESD events. Also, because such circuits are designed to turn the current sinking device off after a certain duration during typical operation, as previously discussed, they typically allow circuits in which they are employed to operate normally after the current sinking device is turned off, usually a time in the duration of several micro-seconds.

As those of skill in the art would appreciate, during an ESD event, tripping the inverters and turning off the current sinking transistor would also be based, at least in part, on the higher voltage applied to terminal 110 associated with such an event. Such a situation would typically result in the current sinking device, transistor 120, remaining on during such an ESD event, as is desirable. These attributes of such a power supply clamp may allow such a circuit to be employed to protect other circuit elements from potential damage or destruction resulting from the current and/or voltage of an ESD event. In this respect, such a circuit would shunt current between the power supply terminal and ground during such an ESD event.

Also, it is sometimes desirable to employ ICs manufactured with different semiconductor manufacturing processes in conjunction with one another. In this situation, these ICs may employ different power supply voltages. In this regard, while one IC may be manufactured using a current generation process, another IC may be manufactured using an older process and employ a higher power supply voltage. In this respect, one technique that may be employed in such a situation is the use of what may be referred to as voltagetolerant circuits.

Figure 2:
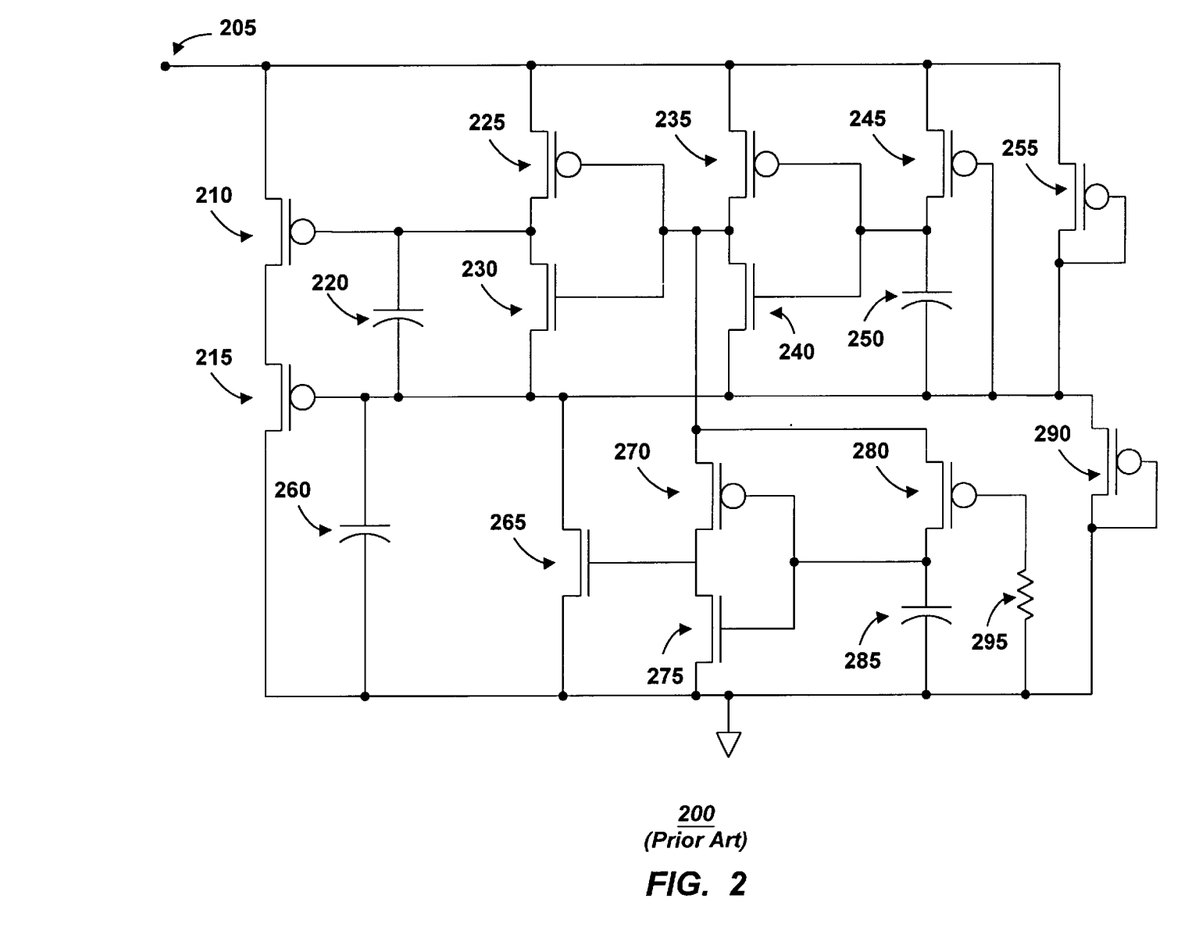
FIG. 2 is a schematic diagram illustrating a current embodiment of a voltage-tolerant power supply clamp.

FIG. 2 illustrates a current embodiment of such a voltage-tolerant power supply clamp. For this particular embodiment, the circuit is designed to be "voltage-tolerant" by employing, for example, stacked current sinking devices 210 and 215. Similarly in this regard, the RC-timer for this embodiment is "stacked" or "staged." The first "stage" of the RC timer comprises p-channel transistor 245 and capacitor 250, while the second stage comprises p-channel transistor 280 and capacitor 285. Those of skill in the art would understand that this arrangement would act as a divider and allow the circuit to "tolerate" signals from an IC employing a higher power supply voltage, as may be associated with ICs manufactured on a previous generation process.

In a similar regard as was discussed with respect to FIG. 1, the RC-timer stages in FIG. 2, and their associated control circuitry, such as, for example, the three inverters, comprising transistors 235 and 240; 225 and 230; and 270 and 275, respectively, would turn current sinking, stacked p-channel transistors 210 and 215 off after a time duration on the order of microseconds. Likewise, during an ESD event, the RC-timer stages and their associated control circuitry would allow current sinking devices 210 and 215 to remain on in order to shunt current from such an event between terminal 205 and ground.

Therefore, as was discussed with respect to FIG. 1, voltage-tolerant power supply clamp 200 would typically allow normal operation of an IC once the current-sinking devices were turned off by employing the RC-timer stages and their associated control circuitry while also supplying the associated benefits of protection from ESD events.

As was indicated above, the functionality of circuits employing RC-timers, such as embodiments 100 and 200, illustrated in FIGS. 1 & 2, may be adversely affected by, at a minimum, gate leakage characteristics of future generations of semiconductor manufacturing processes. In this regard, because capacitors in ICs typically comprise gate oxide, such leakage may result in circuits that employ such capacitors, such as RC-timers, not functioning as desired, though the invention is not limited in scope in this respect. For example, for the embodiment illustrated in FIG. 1, were capacitor 190 to comprise a gate oxide with leakage on the order of that previously discussed for future processes, the RC timer comprising this capacitor and transistor 180 may not charge to a voltage that is high enough to completely "trip" the inverter comprising transistors 160 and 170. That is, the inverter may operate in the linear mode and conduct current between terminal 110 and ground. In such a situation, the inverter comprising transistors 140 and 150 may, in turn operate in the linear mode, which may result in current sinking device 120 remaining partially on, that is also in linear mode. Such a situation may be disadvantageous as an undesired amount of current may be conducted from terminal 110 to ground. This current may, in turn, result in adverse effects on a circuit employing such a power supply clamp. A similar situation may result in the embodiment illustrated in FIG. 2 due, at least in part, to such leakage current through capacitor 250, for example. Therefore, based on the foregoing, alternative embodiments of RC-timers may be desirable.

Figure 3A:
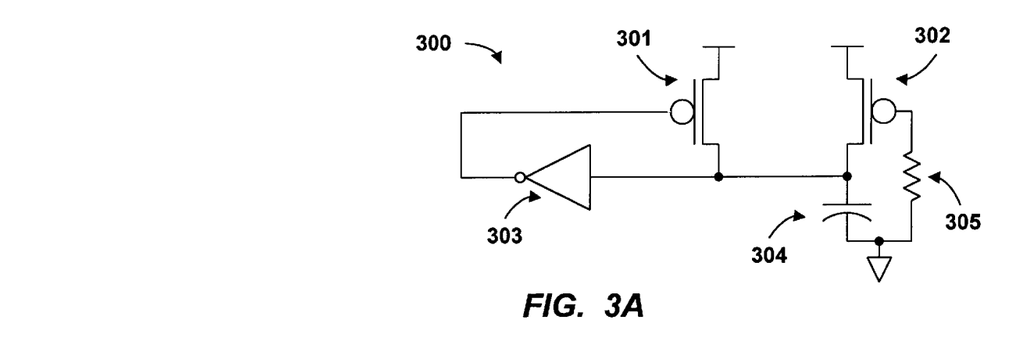
FIG. 3A is a schematic diagram illustrating an embodiment of an RC-timer circuit in accordance with the invention and a power supply clamp in accordance with the invention.

An embodiment of an RC-timer, 300, in accordance with the invention, which addresses at least some of the foregoing concerns is illustrated in FIG. 3A, though the invention of course is not limited to this, or any particular embodiment. This particular embodiment of an RC-timer comprises, in addition to transistor 302 and capacitor 304, inverter 303 and transistor 301. In a similar manner as was previously described, transistor 302 would act as a resistor in the Mohm range for such a timer. However, transistor 301 would typically comprise a short channel transistor having a substantially lower resistance than transistor 302. Therefore, once capacitor 304 charges to a voltage that is above the trip point of inverter 303, that inverter would turn transistor 301 on, which would, in turn, electrically couple the positive plate of capacitor 304 to the power supply terminal via transistor 301. Since transistor 301, for this embodiment, comprises a substantially lower resistance than transistor 302 it may, therefore, allow inverter 303 to more fully transition states, or, that is, reduce the likelihood it will operate in the linear mode, as is desired. In this situation, current through inverter 303 may, therefore, be reduced and, therefore, any amplification of that current by circuitry coupled to such an RC-timer would also be reduced.

Figure 3B:
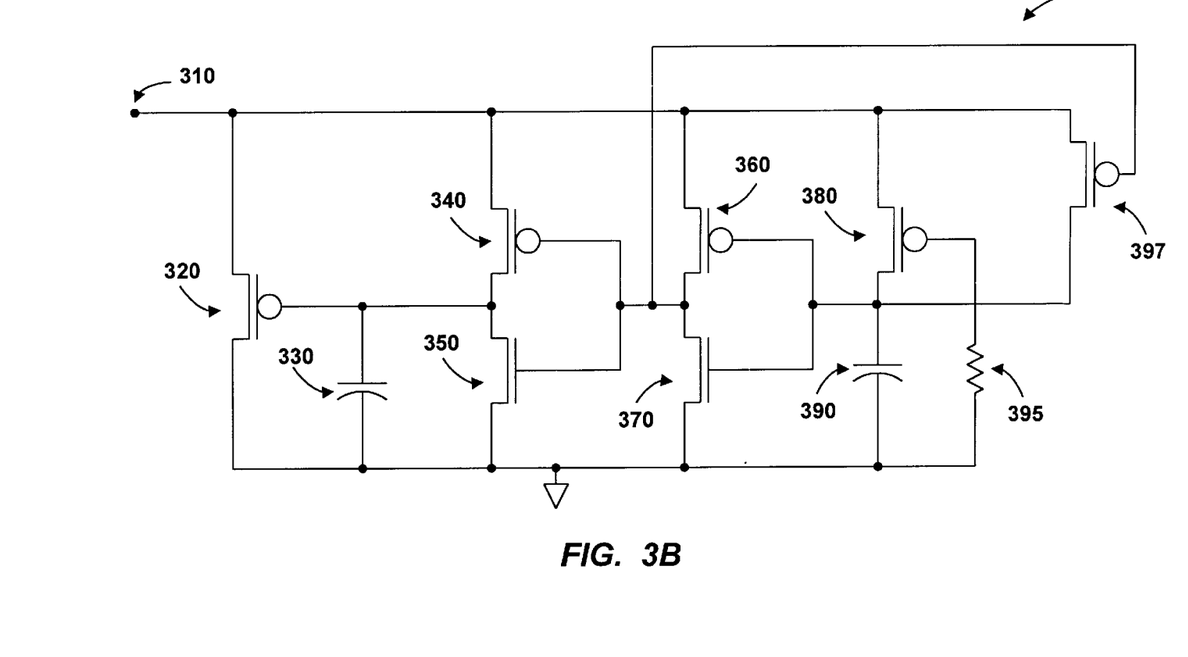
FIG. 3B is a schematic diagram illustrating an embodiment of a power supply clamp.

An embodiment of a power supply clamp, 307, in accordance with the invention is also illustrated in FIG. 3B. This power supply clamp employs an RC-timer in accordance with the invention, such as 300. For this particular embodiment, the RC-timer comprises transistors 380 and 397, capacitor 390, and the inverter comprising transistors 360 and 370. This inverter is also employed as a first drive stage for current sinking device 320, as has been previously described. Use of the output voltage of this inverter to drive the gate of transistor 397 is advantageous, as it may reduce the amount of circuitry employed by such an embodiment. As was previously discussed with respect to RC-timer 300, transistor 397 would be a short channel device and may, therefore, at least in part, compensate for leakage in capacitor 390 in a similar fashion as was discussed with respect to transistor 301. In this respect, once capacitor 390 was charged to a voltage sufficient to begin to trip this inverter, the inverter would turn on transistor 397, which, in turn, would electrically couple the positive plate of capacitor 390 to power supply terminal 310 via a low resistance. As was indicated above, such an arrangement may reduce the effects of leakage in the RC-timer and allow current sinking device 320 to be sufficiently turned off such that it would not affect the normal operation of such an IC.

Figure 4:
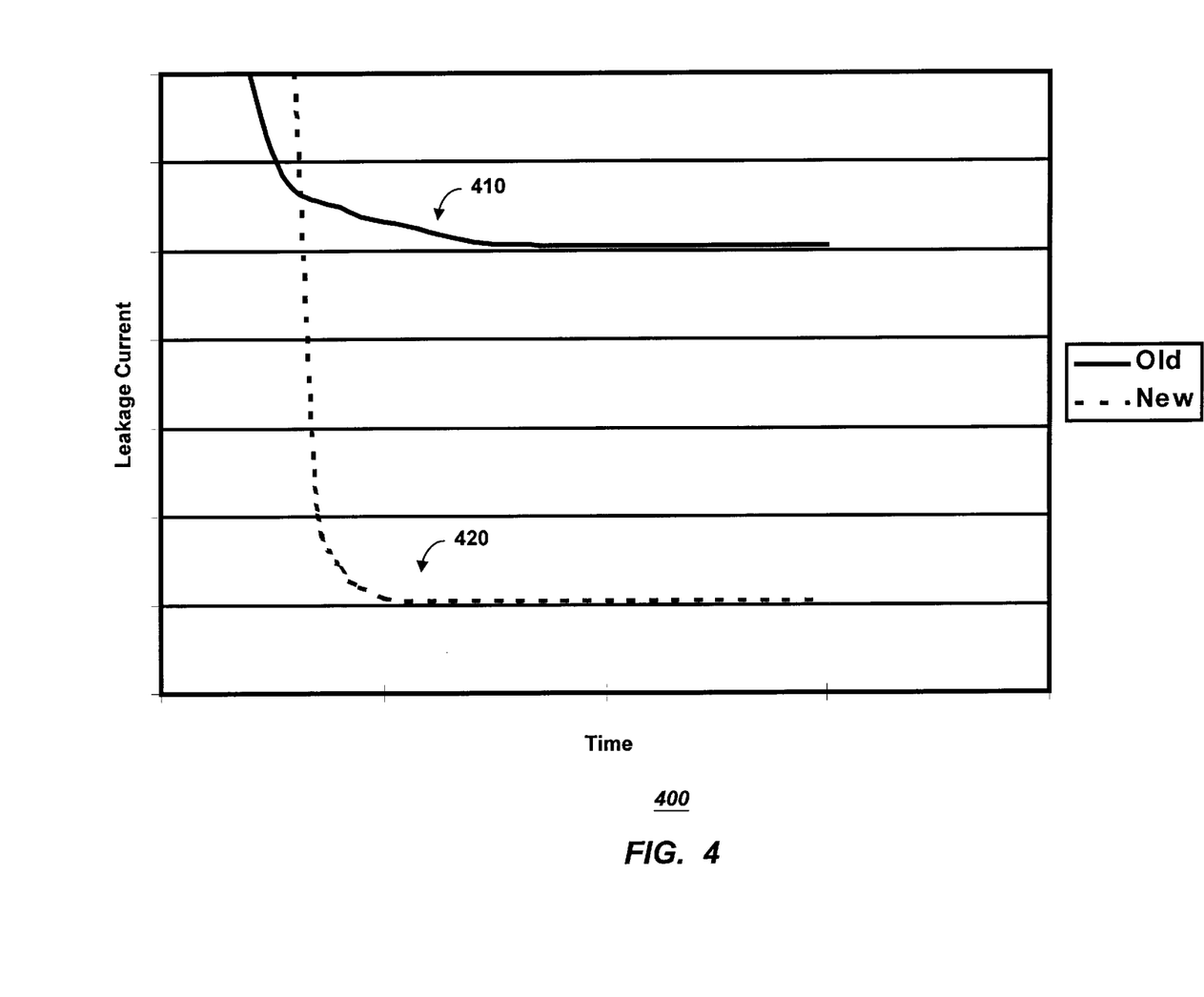
FIG. 4 is a graph illustrating electric current versus time relationships for the power supply clamp embodiments illustrated in FIGS. 1 & 3.

FIG. 4 is a graph that illustrates a comparison of circuit simulation results for an embodiment of a power supply clamp in accordance with the invention versus a current embodiment of a power supply clamp. This graph comprises leakage current versus time data for these embodiments, which are substantially similar to those illustrated in FIG. 3B and FIG. 1, respectively. This data was obtained assuming gate oxide leakage in both embodiments on the order as was previously discussed with respect to future advanced semiconductor manufacturing processes. Trend line 410 in this graph represents the simulation results for the current embodiment of a power supply clamp, while trend line 420 represents the simulation results for the embodiment of a power supply clamp in accordance with the invention. As can be seen from FIG. 4, the effects of gate oxide leakage in future semiconductor processes may adversely affect the performance of such circuits. Comparing trend line 410 with trend line 420 demonstrates that current embodiments (410) may draw substantially more current than is desired, while embodiments in accordance with the invention (420) may produce desirable current versus time characteristics. In this regard, embodiments in accordance with the invention may draw nearly one order of magnitude less current than current embodiments, as is desirable.

Figure 5:
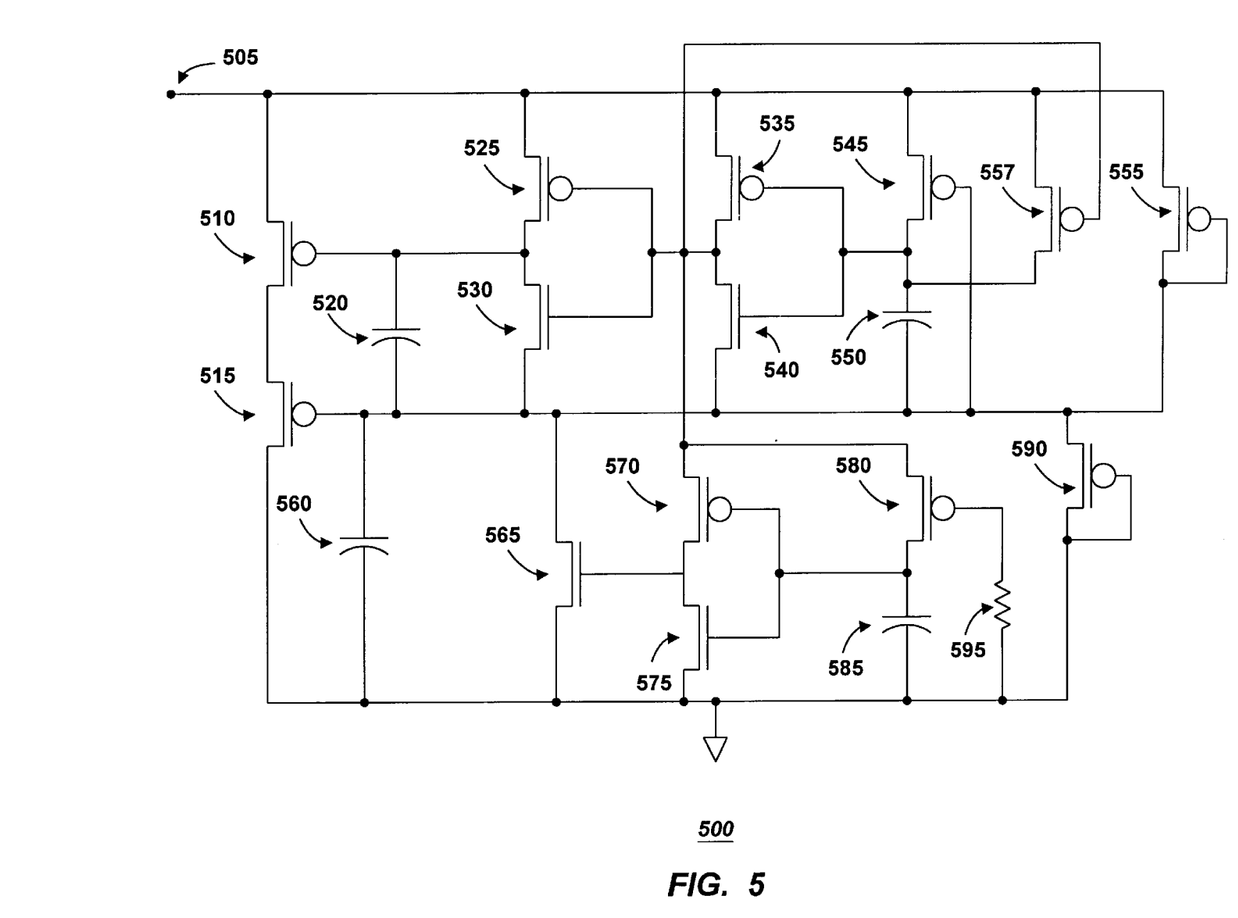
FIG. 5 is a schematic diagram illustrating an embodiment of a voltage-tolerant power supply clamp in accordance with the invention.

FIG. 5 illustrates an embodiment of a voltage-tolerant power supply clamp in accordance with the invention. Here, an embodiment of an RC-timer in accordance with the invention, such as 300, is employed for the first stage RC-timer. This RC-timer comprises transistors 545 and 557, capacitor 550 and the inverter comprising transistors 535 and 540 and would operate in a substantially similar manner as was described with respect to the embodiments illustrated in FIG. 3A. In this regard, compensating for gate oxide leakage in accordance with the invention may reduce the effects of linear mode operation and amplification, as were previously discussed. These reduced effects may, in turn, allow current sinking devices 510 and 515 to be sufficiently turned off such that they do not affect the normal operation of an IC in which such a power supply clamp is employed.

Figure 6:
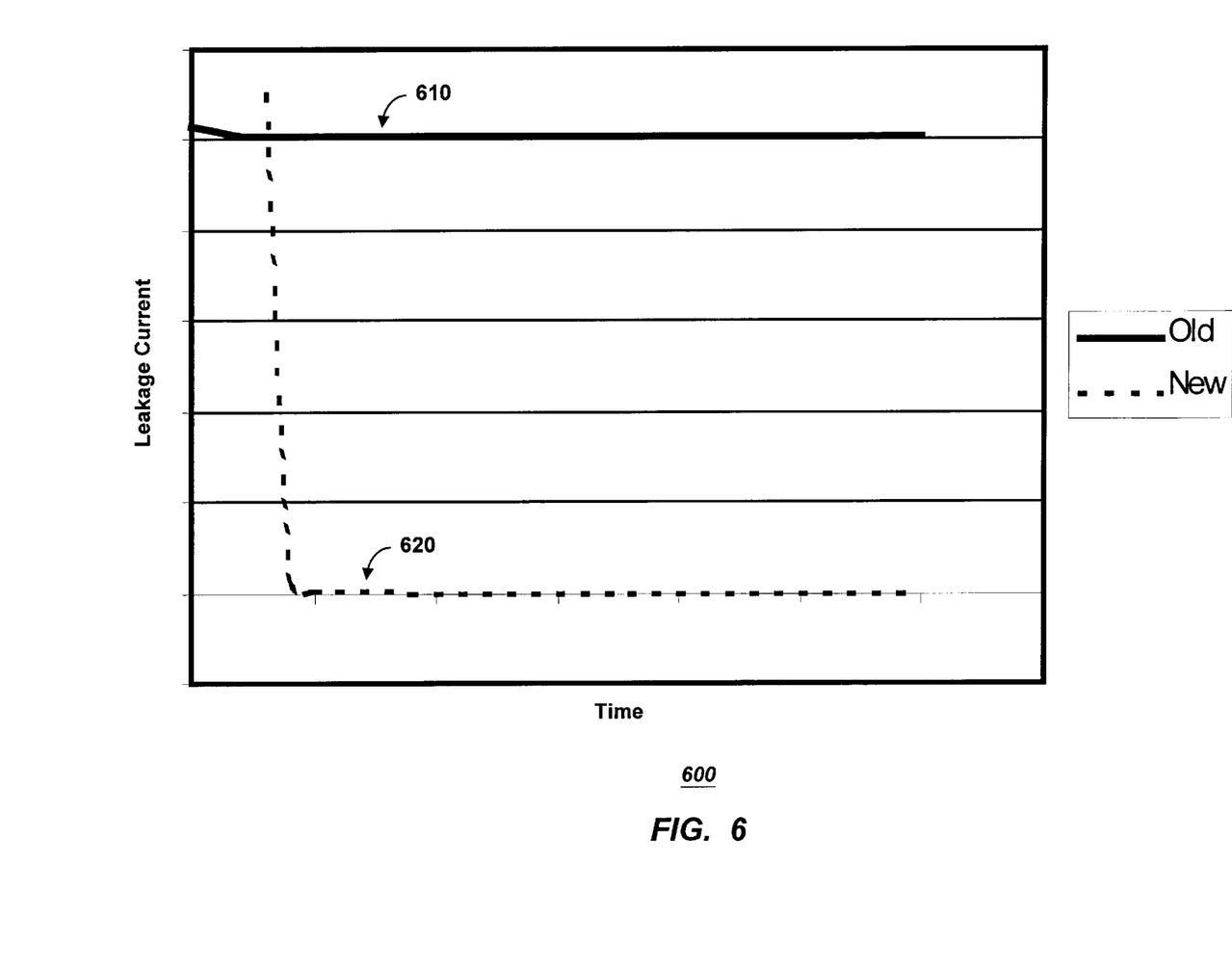
FIG. 6 is a graph illustrating electric current versus time relationships for the embodiments illustrated in FIGS. 2 & 5.

FIG. 6 is a graph that illustrates a comparison of circuit simulation results for an embodiment of a voltage-tolerant power supply clamp in accordance with the invention versus a current embodiment of a voltage-tolerant power supply clamp. This graph comprises leakage current versus time data for these embodiments, which are substantially similar to those illustrated in FIG. 5 and FIG. 2, respectively. The data was obtained assuming gate oxide leakage in both embodiments on the order as was previously discussed with respect to future advanced semiconductor manufacturing processes. Trend line 610 in this graph represent the simulation results for the current embodiment of a voltage-tolerant power supply clamp, while trend line 620 represents the simulation results for the embodiment of a voltage-tolerant power supply clamp in accordance with the invention. As may be seen from FIG. 6, gate oxide leakage characteristics of future semiconductor processes may adversely affect the performance of such power supply clamp circuits, such as has been previously discussed. Comparing trend line 610 with trend line 620 demonstrates that current embodiments (610) may draw substantially more current than is desired, while embodiments in accordance with the invention (620) may produce desirable current versus time characteristics. In this regard, embodiments in accordance with the invention may draw nearly four orders of magnitude less current than current embodiments, as is desirable. For such embodiments, the substantial difference in relative current characteristics for voltage-tolerant power supply clamps as opposed to non-voltage-tolerant power supply clamps may be due, at least in part, to the larger device at the top of the stack (210 as compared to 120). Also, the additional drive stages of such a voltage-tolerant power supply clamp contribute to such current characteristics.

Therefore, employing embodiments in accordance with the invention may be even more advantageous in this regard.

Figure 7A:
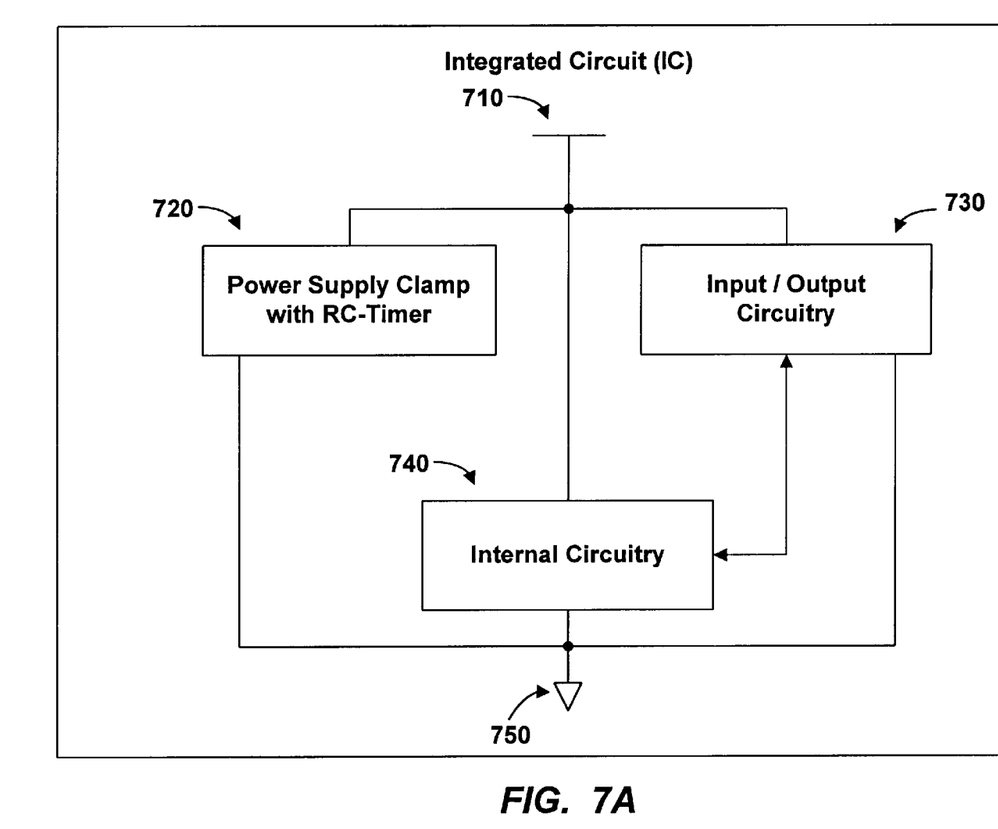
FIG. 7A is a block diagram illustrating an embodiment of an integrated circuit (IC) in accordance with the invention.
Figure 7B:
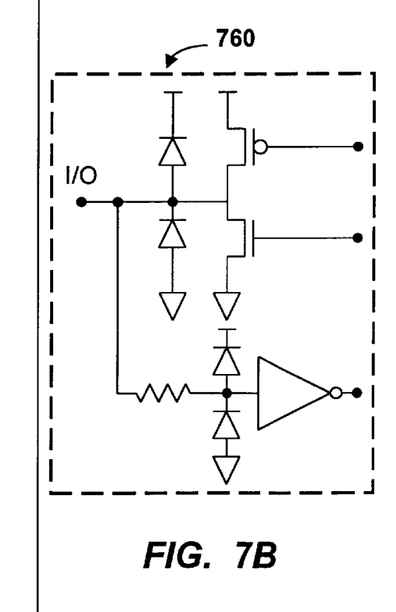
FIG. 7B is an example of a schematic diagram of an ESD protection circuit.

FIG. 7A illustrates an embodiment of an IC in accordance with the invention. For this particular embodiment, though the invention is not limited in scope in this respect, an ESD protection circuit scheme may be embodied on such an IC. This ESD protection circuit scheme may comprise a power supply clamp, 720, including an RC-timer in accordance with the invention. Such an ESD protection circuit scheme may further comprise Input/Output (I/O) circuitry, 730, specifically adapted to reduce the effects of such ESD events. Such ESD protection circuits are well known in the art. Though the invention is, of course, not limited in scope in this respect, an example of one such ESD-protection circuit is schematically illustrated in block 760 of FIG. 7B.

Such I/O circuitry would typically be coupled to power supply clamp 720 via a power supply terminal, such as 710. Though the invention is of course not limited in scope in this respect, in such an IC, I/O circuitry 730 may then be further coupled to internal circuitry 740. Such internal circuitry, for example, may comprise a microprocessor, an SRAM array, a micro-controller or any number of other circuit embodiments that may exist. Such circuit embodiments are given by way of example and the invention is, of course, not limited in scope to use with these, or any particular types of circuits.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A circuit comprising:
   a resistive capacitive timer (RC-timer), wherein said RC-timer comprises a resistor (302) and a capacitor (304); and a p-channel transistor (301) and an inverter (303) having a trip point coupled to said RC-timer, wherein said p-channel transistor electrically couples said capacitor to a power supply terminal if said p-channel transistor is turned on, wherein said p-channel transistor is turned on by said inverter if said capacitor charges to a voltage that is greater than said inverter's trip point.

2. The circuit of claim 1 further comprising: a clamp circuit coupled with said RC-timer.

3. The circuit of claim 2, wherein a power supply terminal and a ground terminal are electrically coupled, during an electrostatic discharge (ESD) event, via said clamp circuit.

4. The circuit of claim 3, wherein said clamp circuit comprises a current sinking device.

5. The circuit of claim 4, wherein said current sinking device comprises a p-channel transistor.

6. The circuit of claim 2, wherein the RC-timer and said clamp circuit comprise stacked transistors or stages supply terminal based, at least in part, on said voltage on said terminal.

7. A method of timing electrical events comprising:
charging a resistive-capacitor timer (RC-timer);
sensing a voltage on a terminal, wherein said terminal is coupled to a positive plate included in said RC-timer;
electrically coupling, via low resistance, said positive plate to a power supply terminal based, at least in part, on said voltage on said terminal; and
triggering a clamping circuit in response to an electrostatic discharge.

8. The method of claim 7, further comprising:
shunting current resulting, at least in part, from said ESD event between a power supply terminal and a ground terminal.

9. An integrated circuit (IC) comprising:
an electrostatic discharge (ESD) protection circuit, wherein said ESD protection circuit comprises:
a power supply clamp including a RC-timer, wherein said RC-timer comprises a resistor and a capacitor, wherein said capacitor comprises a positive and a negative plate; and
a transistor, wherein said transistor couples said positive plate of said capacitor to a power supply to compensate for a leakage current through said capacitor.

10. The IC of claim 9, further comprising:
internal circuitry and input/output (I/O) circuitry, coupled such that said power supply clamp and said I/O circuitry have the capability to shunt current resulting, at least in part, from an ESD event away from said internal circuitry.

11. The IC of claim 10, wherein said IC comprises a microprocessor.

12. The IC of claim 9, wherein said power supply clamp comprises a current sinking device coupled so as to electrically couple a power supply terminal and a ground terminal during an ESD event.

13. The IC of claim 12, wherein said current sinking device comprises a p-channel transistor.

14. The IC of claim 13, wherein said clamping device comprises a plurality of stacked p-channel transistors.

* * * * *

UNITED STATES PATENT AND TRADEMARK OFFICE
CERTIFICATE OF CORRECTION

PATENT NO.    : 6,510,033 B1
DATED         : January 21, 2003
INVENTOR(S)   : Maloney et al.

It is certified that error appears in the above-identified patent and that said Letters Patent is hereby corrected as shown below:

Column 7,
Line 19, delete "supply terminal based, at least in part, on said voltage on said terminal".
Line 30, after "discharge", insert -- (ESD) event --.

Signed and Sealed this

Eighth Day of July, 2003

JAMES E. ROGAN
*Director of the United States Patent and Trademark Office*